US011935863B2

United States Patent
Kobayashi et al.

(10) Patent No.: US 11,935,863 B2
(45) Date of Patent: Mar. 19, 2024

(54) LASER REFLOW APPARATUS AND LASER REFLOW METHOD

(71) Applicant: DISCO CORPORATION, Tokyo (JP)

(72) Inventors: Satoshi Kobayashi, Tokyo (JP); Youngsuk Kim, Tokyo (JP); Nobuyuki Kimura, Tokyo (JP); Yuki Ikku, Tokyo (JP); Zhiwen Chen, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 453 days.

(21) Appl. No.: 17/123,318

(22) Filed: Dec. 16, 2020

(65) Prior Publication Data

US 2021/0202431 A1 Jul. 1, 2021

(30) Foreign Application Priority Data

Dec. 25, 2019 (JP) ................. 2019-234128

(51) Int. Cl.
| | |
|---|---|
| *H01L 23/00* | (2006.01) |
| *B23K 1/00* | (2006.01) |
| *B23K 1/005* | (2006.01) |
| *B23K 3/08* | (2006.01) |
| *B23K 26/03* | (2006.01) |
| *B23K 26/06* | (2014.01) |

(Continued)

(52) U.S. Cl.
CPC ............ *H01L 24/75* (2013.01); *B23K 1/0016* (2013.01); *B23K 1/0056* (2013.01); *B23K 3/08* (2013.01); *B23K 26/034* (2013.01); *B23K 26/0608* (2013.01); *B23K 26/0648* (2013.01); *B23K 26/0665* (2013.01); *G02B 19/0009* (2013.01); *G02B 19/0047* (2013.01); *H01L 24/81* (2013.01); *B23K 2101/40* (2018.08); *G02B 27/30* (2013.01); *H01L 2224/75253* (2013.01); *H01L 2224/75263* (2013.01); *H01L 2224/7555* (2013.01); *H01L 2224/81224* (2013.01); *H01L 2224/81815* (2013.01); *H01L 2924/3511* (2013.01)

(58) Field of Classification Search
CPC .. B23K 26/034; B23K 1/0016; B23K 26/082; H01L 25/50; H01L 2224/75263; H01L 25/18

See application file for complete search history.

(56) References Cited

U.S. PATENT DOCUMENTS

| | | | |
|---|---|---|---|
| 2019/0273074 A1* | 9/2019 | Cho | ............... H01L 24/85 |
| 2020/0091108 A1* | 3/2020 | Kim | ............... H01L 24/81 |

FOREIGN PATENT DOCUMENTS

| | | | | | |
|---|---|---|---|---|---|
| JP | 2008177240 A | * | 7/2008 | ............ | B23K 1/0056 |
| JP | 2008177240 A | | 7/2008 | | |
| WO | WO-2010018680 A1 | * | 2/2010 | ............ | B23K 1/0056 |

* cited by examiner

*Primary Examiner* — Thien S Tran (74) *Attorney, Agent, or Firm* — GREER BURNS & CRAIN, LTD.

(57) ABSTRACT

A laser reflow apparatus reflows solder bumps disposed on a side of a semiconductor chip in a workpiece and included in an irradiation range on the workpiece by applying a laser beam to an opposite side of the semiconductor chip. The laser reflow apparatus includes a spatial beam modulation unit including a laser power density setting function to locally set the laser power density in the irradiation range of a laser beam emitted from a laser beam source, and an image focusing unit including an image focusing function to focus the laser beam emitted from the laser beam source and apply the focused laser beam to the irradiation range on the workpiece.

19 Claims, 9 Drawing Sheets

(51) Int. Cl.
 B23K 101/40 (2006.01)
 G02B 19/00 (2006.01)
 G02B 27/30 (2006.01)

FIG.10

LASER REFLOW APPARATUS AND LASER REFLOW METHOD

BACKGROUND OF THE INVENTION

Field of the Invention

The present invention relates to a laser reflow apparatus and a laser reflow method for reflowing solder bumps by which a semiconductor chip is connected to a board in a workpiece by applying a laser beam to the workpiece through the semiconductor chip.

Description of the Related Art

Heretofore, there has been known a flip-chip packaging technology in which a semiconductor chip having solder bumps is flipped over and placed on a board with the solder bumps interposed therebetween and the entire assembly of the board and the chip is heated to melt the solder bump to connect to electrodes on the board.

The flip-chip packaging technology includes a known mass reflow process for heating a board in its entirety for bonding semiconductor chips to the board. According to the mass reflow process, there is known the possibility that while the board is being heated, the board may be warped to a large extent due to the difference between its own coefficient of thermal expansion and the coefficient of thermal expansion of a plurality of semiconductor chips placed on the board, causing the semiconductor chips to move and bringing about defects such as nonconnections or short circuits.

In addition, there is also known a thermo-compression bonding (TCB) process for heating and compressing semiconductor chips to bond them to a board. It is known that the TCB process takes time to cool the bonder head and has poor productivity.

A laser reflow process disclosed in Japanese Patent Laid-Open 2008-177240, for example, is known as a process that is more advantageous than the above processes. According to the laser reflow process, within a predetermined range on the mounting surface of a board, a laser beam is applied from above chips to melt solder bumps thereon, connecting the chips to electrodes on the board.

The laser reflow process is advantageous in that it achieves higher productivity than the TCB process by applying a laser beam to a plurality of chips and does not cause the board to warp largely as the mass reflow process.

SUMMARY OF THE INVENTION

Though the laser reflow process has advantages of its own as described above, it still suffers a substrate warpage problem because the board is heated by the laser beam applied thereto, and hence remains to be improved further.

It would be worth considering that the rise in the temperature of the board might be suppressed simply by reducing the output power of the laser. However, the reduced output power of the laser might not sufficiently melt the solder bumps, possibly resulting in connection failures.

There has also been known in the art, in addition to the flip-chip packaging technology for mounting semiconductor chips on boards, a wafer-on-wafer technology where two wafers prior to being divided into semiconductor chips are stacked on one on the other and solder bumps on the semiconductor chips are connected while on the wafers. However, there is still concern for wafer warpage in wafer-on-wafer applications.

It is therefore an object of the present invention to provide a laser reflow apparatus and a laser reflow method that are capable of restraining a workpiece from warping due to heat and at the same time reducing bump connection failures.

In accordance with an aspect of the present invention, there is provided a laser reflow apparatus for reflowing solder bumps disposed on a side of a semiconductor chip in a workpiece and included in an irradiation range on the workpiece by applying a laser beam to an opposite side of the semiconductor chip, including (A) a spatial beam modulation unit including a laser power density setting function to locally set the laser power density in the irradiation range of a laser beam emitted from a laser beam source, and an image focusing unit including an image focusing function to focus the laser beam emitted from the laser beam source and apply the focused laser beam to the irradiation range on the workpiece, or (B) a spatial beam modulation unit including a laser power density setting function to locally set the laser power density in the irradiation range of the laser beam emitted from the laser beam source and an image focusing function to focus the laser beam emitted from the laser beam source and apply the focused laser beam to the irradiation range on the workpiece.

Preferably, the laser reflow apparatus further includes an irradiation range changing unit for changing a position of the irradiation range on the workpiece.

Preferably, the spatial beam modulation unit sets a laser power density of a laser beam applied to a bump area where solder bumps are present in the irradiation range to a level higher than a laser power density of a laser beam applied to a bump-free area where no bumps are present.

Preferably, the laser reflow apparatus further includes a uniform irradiation unit disposed between the laser beam source and the spatial beam modulation unit, for uniformizing the laser power density of the laser beam emitted from the laser beam source on an entrance surface of the spatial beam modulation unit.

Preferably, the laser beam source includes a plurality of laser beam sources.

Preferably, the laser reflow apparatus further includes a temperature detector for detecting a temperature of an upper surface of the workpiece.

Preferably, the laser reflow apparatus further includes a pressing member for pressing an upper surface of the workpiece, the pressing member being made of a material that is capable of transmitting therethrough a laser beam applied to the workpiece.

In accordance with another aspect of the present invention, there is provided a laser reflow method using a laser reflow apparatus for reflowing solder bumps disposed on a side of a semiconductor chip in a workpiece and included in an irradiation range on the workpiece by applying a laser beam to an opposite side of the semiconductor chip, the laser reflow apparatus including a spatial beam modulation unit including a laser power density setting function to locally set the laser power density in the irradiation range of a laser beam emitted from a laser beam source, and an image focusing unit including an image focusing function to focus the laser beam emitted from the laser beam source and apply the focused laser beam to the irradiation range on the workpiece, or a spatial beam modulation unit including a laser power density setting function to locally set the laser power density in the irradiation range of the laser beam emitted from the laser beam source and an image focusing function to focus the laser beam emitted from the laser beam source and apply the focused laser beam to the irradiation range on the workpiece. The laser reflow method includes individually setting laser power densities of laser beams to be applied respectively to particular areas in the irradiation range.

According to the aspect and the other aspect of the present invention, since the laser reflow apparatus incorporates the spatial beam modulation unit, it is capable of setting a laser power density locally in the irradiation range. For example, a laser beam having a high laser power can be applied to only solder bump areas to reliably melt solder bumps while restraining the workpiece from warping by not wastefully heating unnecessary areas, thereby preventing pump connection failures.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
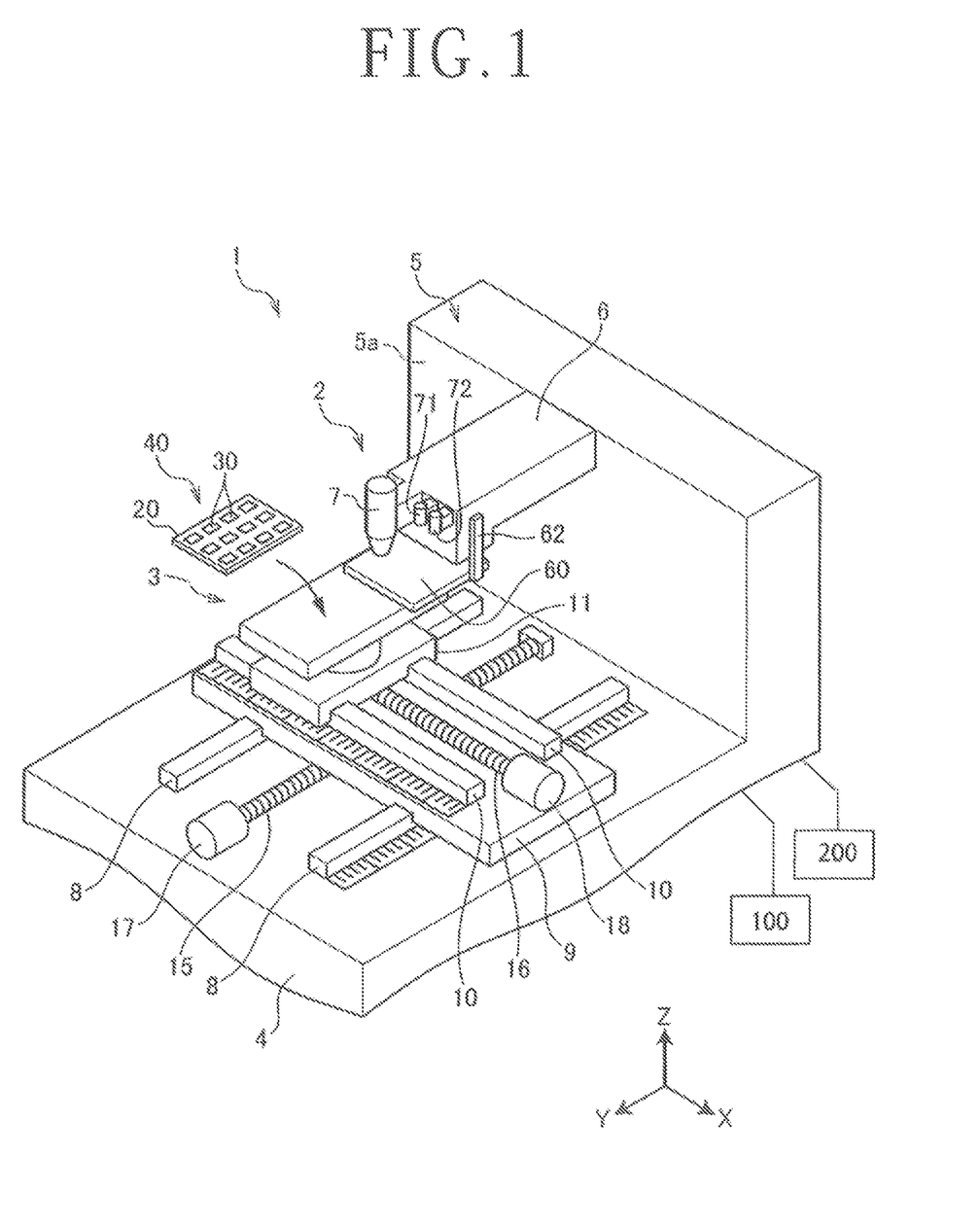
FIG. 1 is a perspective view illustrating a structural example of a laser reflow apparatus according to an embodiment of the present invention.

A laser reflow apparatus according to an embodiment of the present invention will be described below with reference to the accompanying drawings. As illustrated in FIG. 1, the laser reflow apparatus 1 includes a laser beam applying unit 2 for applying a laser beam to a workpiece 40 and a processing table 3 for holding the workpiece 40 thereon. The laser reflow apparatus 1 processes the workpiece 40 held on the processing table 3 with the laser beam by moving the processing table 3 relatively to the laser beam applying unit 2.

The workpiece 40 includes a rectangular board 20 on which an array of semiconductor chips 30 is disposed with their face sides facing downwardly. The semiconductor chips 30 are mounted on the board 20 according to a flip-chip packaging process by reflowing solder bumps on the face sides of the semiconductor chips 30 with a laser beam. The board 20 may be a printed-circuit board (PCB), a device wafer prior to being divided into chips, or the like, for example.

Figure 5A:
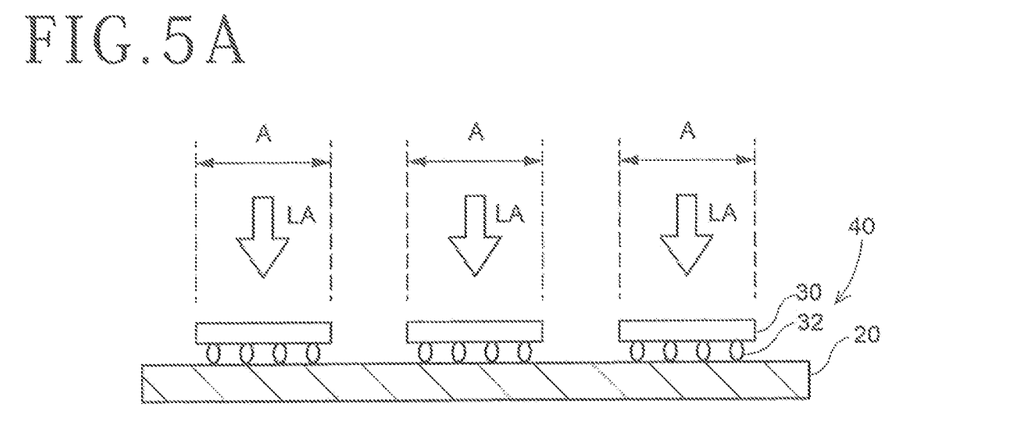
FIG. 5A is a view illustrating an example in which a laser beam is applied to only areas where semiconductor chips are present.
Figure 5B:
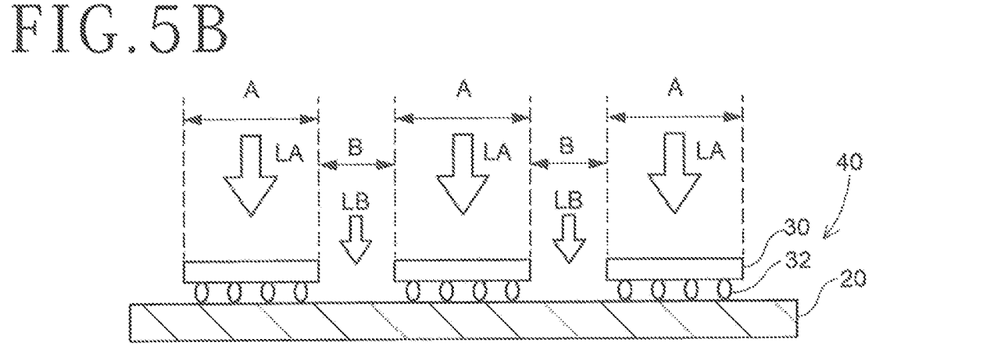
FIG. 5B is a view illustrating an example in which different laser power densities are set for respective areas.
Figure 5C:
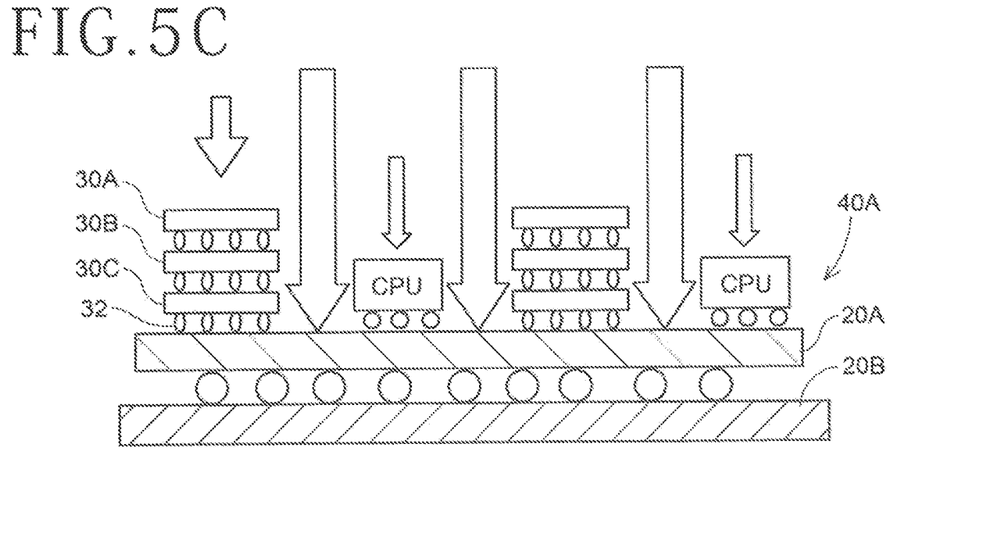
FIG. 5C is a view illustrating an example in which a laser reflow process is carried out on stacked semiconductor chips.

Note that the workpiece 40 may be of a structure where semiconductor chips 30 are arrayed on a board 20 with solder bumps 32 interposed therebetween, as illustrated in FIG. 5A, or a structure where semiconductor chips 30A, 30B, and 30C are stacked with solder bumps interposed therebetween, as illustrated in FIG. 5C. Furthermore, the present invention is also applicable to wafer-on-wafer applications where a plurality of device wafers are stacked and connected by solder bumps. In the latter case, the stack of device wafers is handled as the workpiece 40.

As illustrated in FIG. 1, the laser reflow apparatus 1 includes a base 4 and a vertical wall 5 erected on a rear end portion of the base 4. An arm 6 protrudes forwardly from an upper end portion of a front surface 5a of the vertical wall 5. The laser beam applying unit 2 includes a processing head 7 mounted on the distal end of the arm 6. The processing head 7 converges a laser beam emitted from a laser beam source to be described later and applies the converged laser beam to the workpiece 40 held on the processing table 3.

According to the present embodiment, the processing table 3 is rotatable in θ directions about a Z-axis by a rotating mechanism, not depicted, though it may not be rotatable or fixed against rotation. In a case where the workpiece 40 is placed obliquely to the processing head 7, however, it is effective for the processing table 3 to incorporate a rotating mechanism.

On an upper surface of the base 4, there are disposed a pair of guide rails 8 extending in Y-axis directions, a Y-axis table 9 slidably supported on the guide rails 8, an electric motor 17, and a ball screw 15 rotatable about its central axis by the electric motor 17. The Y-axis table 9 is operatively coupled to the ball screw 15 by a nut, not depicted, on the Y-axis table 9. When the electric motor 17 is energized, it rotates the ball screw 15 about its central axis, causing the nut to move the Y-axis table 9 in the Y-axis directions. The guide rails 8, the Y-axis table 9, the electric motor 17, and the ball screw 15 jointly make up a Y-axis moving mechanism.

On an upper surface of the Y-axis table 9, there are disposed a pair of guide rails 10 extending in X-axis directions, an X-axis table 11 slidably supported on the guide rails 10, an electric motor 18, and a ball screw 16 rotatable about its central axis by the electric motor 18. The X-axis table 11 is operatively coupled to the ball screw 16 by a nut, not depicted, on the X-axis table 11. When the electric motor 18 is energized, it rotates the ball screw 16 about its central axis, causing the nut to move the X-axis table 11 in the X-axis directions. The guide rails 10, the X-axis table 11, the electric motor 18, and the ball screw 16 jointly make up an X-axis moving mechanism.

The arm 6 supports on the distal end thereof, sideways of the processing head 7, an image capturing camera 71 for use in positionally aligning the workpiece 40 and the processing head 7 and a temperature detector 72 for detecting the temperature of the workpiece 40. The image capturing camera 71 includes a charge-coupled device (CCD) whereas the temperature detector 72 includes an infrared camera, for example.

A pressing member 60 is supported on the arm 6 below the processing head 7 in facing relation to the upper surfaces of the semiconductor chips 30. The pressing member 60 acts to press the semiconductor chips 30 from above to prevent the semiconductor chips 30 from warping and shifting when the board 20 is thermally deformed and tends to warp. The pressing member 60 is made of a material that is capable of transmitting therethrough a laser beam applied to the workpiece 40. According to the present embodiment, the pressing member 60 is shaped as a flat plate and is vertically movable by a lifting and lowering mechanism 62 mounted on side surfaces of the arm 6.

Part of a laser beam applied to the workpiece 40 is reflected by the semiconductor chips 30. When the reflected laser beam reaches an upper surface of the pressing member 60, part of the reflected laser beam is reflected again by the upper surface of the pressing member 60 and travels to the semiconductor chips 30, which absorb the applied laser beam. In this manner, the pressing member 60 serves the purpose of causing multiple reflection of the laser beam for an increased processing efficiency.

The laser reflow apparatus 1 includes a control device 100 for controlling various functions realized by the laser reflow apparatus 1, such as operation of the laser beam applying unit 2, movement of the processing table 3 in the X- and Y-axis directions, and control of the image capturing camera 71 and the temperature detector 72.

The laser reflow apparatus 1 further includes an input device 200 for entering a processing condition for the workpiece 40 and attribute information of the workpiece 40 into the control device 100. The input device 200 may be a touch panel or the like.

Figure 2:
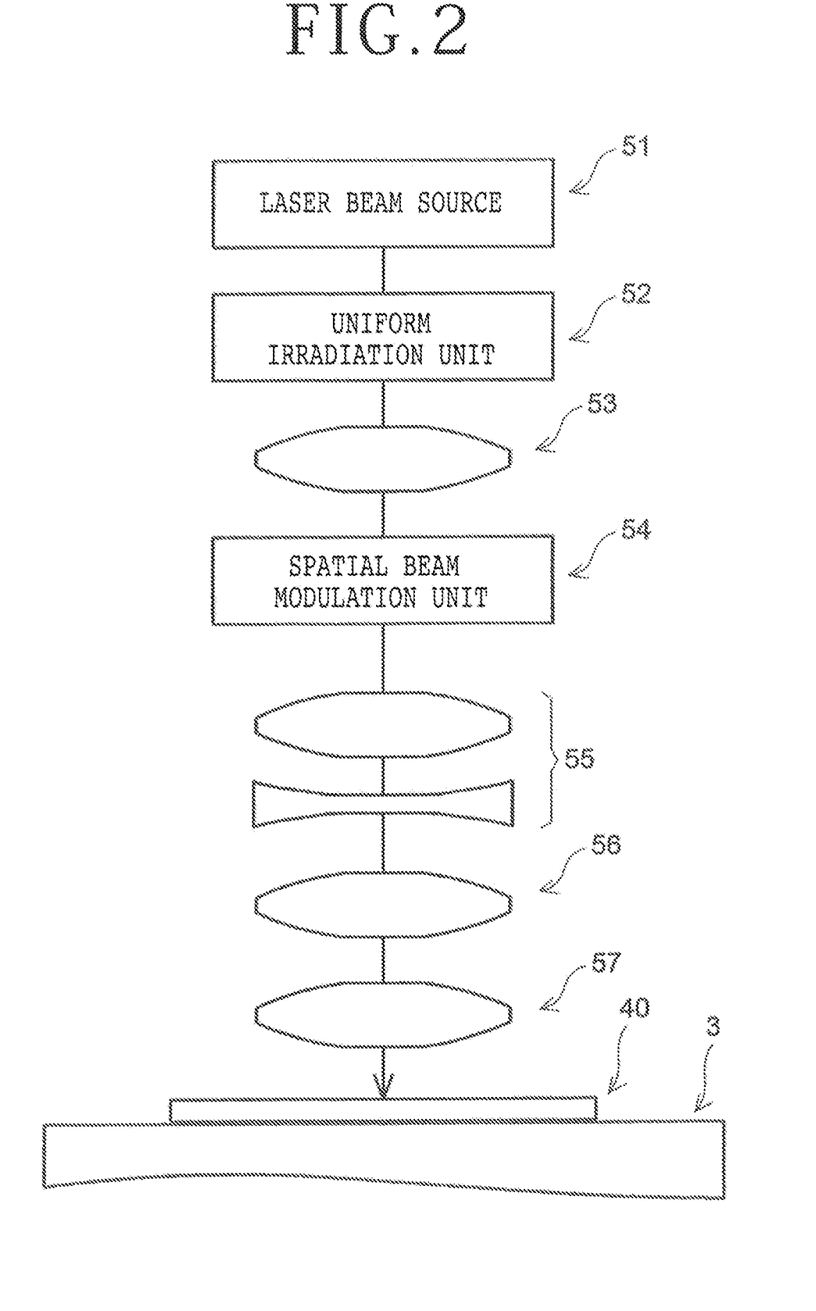
FIG. 2 is a block diagram illustrating a structural example of an optical system included in the laser reflow apparatus.

The laser beam applying unit 2 includes an optical system illustrated in FIG. 2. The optical system will be described in detail below with reference to FIG. 2.

As illustrated in FIG. 2, the laser beam applying unit 2 includes a laser beam source 51, a uniform irradiation unit 52, a beam guide unit 53, a spatial beam modulation unit 54, an image focusing unit 55, a magnifying image focusing lens 56, and a telecentric lens 57.

The laser beam source 51 is in the form of a fiber laser, a single beam source having a single laser diode (LD), or a multiple beam source including a plurality of laser diodes.

A laser beam emitted from the laser beam source 51 is a continuous-wave (CW) laser beam having a wavelength that can be absorbed by the workpiece 40, i.e., the semiconductor chips 30. In a case where the semiconductor chips 30 are made of silicon, the laser beam emitted from the laser beam source 51 has a wavelength ranging from 400 nm to 1100 nm, for example, though it may have a shorter wavelength. If the laser beam has a shorter wavelength, then its reflection from the upper surfaces of the semiconductor chips 30 increases. If the laser beam has a longer wavelength, then its reflection from the upper surfaces of the semiconductor chips 30 decreases, but its transmission through the semiconductor chips 30 increases. According to the present embodiment, the wavelength of the laser beam should preferably range from 900 nm to 1000 nm for reducing the reflection from the upper surfaces of the semiconductor chips 30 and securing the absorption by the semiconductor chips 30.

The uniform irradiation unit 52 illustrated in FIG. 2 acts to form a uniform irradiation surface on the spatial beam modulation unit 54 with a laser beam emitted from the uniform irradiation unit 52. The laser beam has a uniform laser power density in the uniform irradiation surface.

In a case where the laser beam source 51 is a multiple beam source, it is particularly preferable to incorporate the uniform irradiation unit 52 in the optical system. In a case where the laser beam source 51 is a single beam source or a beam source having a Gaussian distribution, the uniform irradiation unit 52 should preferably be incorporated for achieving a complete top-hat distribution. Furthermore, in a case where the laser beam source 51 is a beam source having a top-hat distribution, the uniform irradiation unit 52 should preferably be incorporated for achieving a more complete top-hat distribution.

Figure 3A:
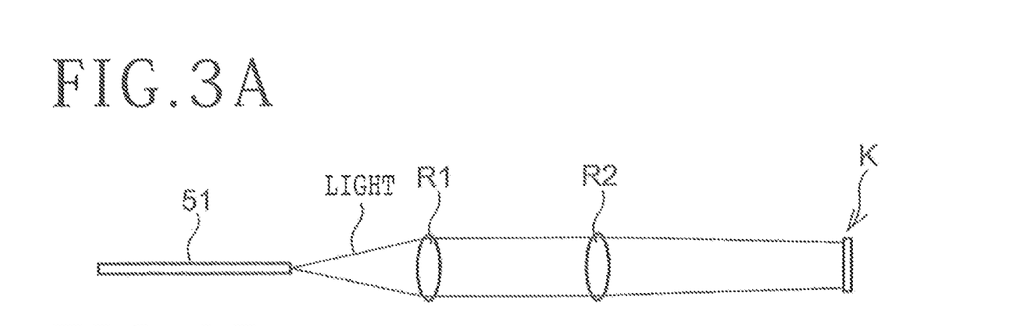
FIG. 3A is a view of a uniform irradiation unit including a collimator lens and an aspherical lens.
Figure 3B:
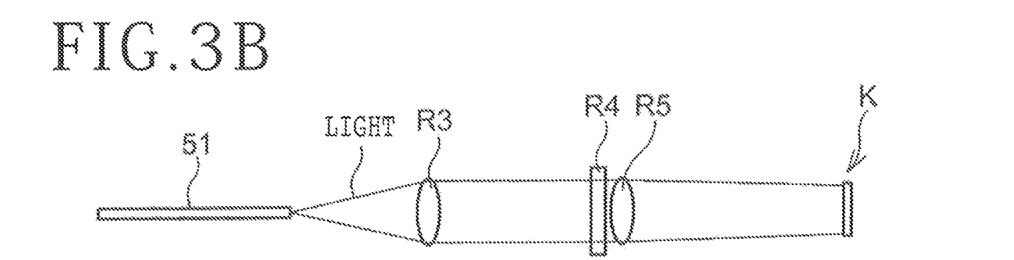
FIG. 3B is a view of a uniform irradiation unit including a collimator lens and a diffractive optical element (DOE)
Figure 3C:
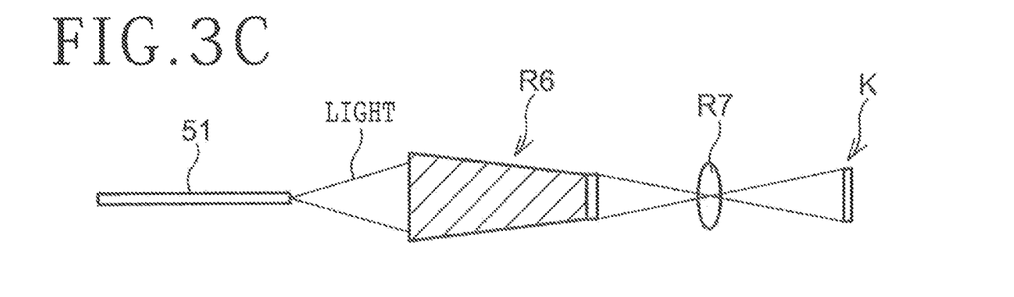
FIG. 3C is a view of a uniform irradiation unit including a rod lens and a beam guide unit.
Figure 3D:
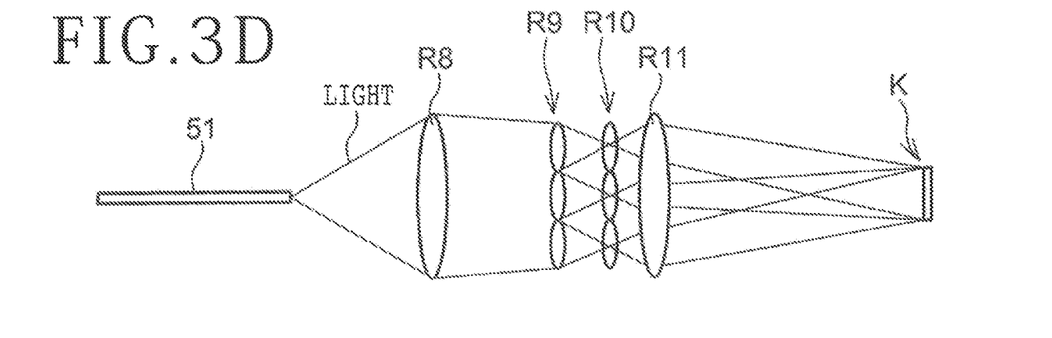
FIG. 3D is a view of a uniform irradiation unit including a collimator lens, a lens array, and a condenser lens.

The uniform irradiation unit 52 may include, as illustrated in FIG. 3A, a combination of a collimator lens R1 and an aspherical lens R2 for forming a uniform irradiation surface K. Alternatively, the uniform irradiation unit 52 may include, as illustrated in FIG. 3B, a combination of a collimator lens R3, a diffractive optical element (DOE) R4, and a condensing lens R5 for forming a uniform irradiation surface K. Further alternatively, the uniform irradiation unit 52 may include, as illustrated in FIG. 3C, a combination of a rod lens R6 shaped as a tubular member filled with glass and a beam guide unit R7 such as a relay lens or an optical fiber for forming a uniform irradiation surface K. According to a yet further alternative, the uniform irradiation unit 52 may include, as illustrated in FIG. 3D, a combination of a collimator lens R8, first and second lens arrays R9 and R10 each including an array of rod lenses or a lens having a surface processed into an array of lenses, and a condensing lens R11 for forming a uniform irradiation surface K. Note that, in the structure of the uniform irradiation unit 52 illustrated in FIG. 3C, the rod lens R6 may be replaced with a light pipe shaped as a hollow tubular member surrounded by a mirror, also referred to as a homogenizer rod.

Furthermore, the rod lens R6 or light pipe illustrated in FIG. 3C may have an exit end smaller in diameter than an entrance end, as illustrated, or may have an exit end identical in diameter to an entrance end, or may have an exit end larger in diameter than an entrance end.

The beam guide unit 53 illustrated in FIG. 2 is a unit for transferring a laser beam from the uniform irradiation surface formed by the uniform irradiation unit 52 or directly from the laser beam source 51 to the spatial beam modulation unit 54. The beam guide unit 53 may be an optical fiber or a relay lens, i.e., a set lens. If the beam guide unit 53 is a set lens, then the distance between the beam guide unit 53 and the spatial beam modulation unit 54 can be made larger than if the beam guide unit 53 is an optical fiber, allowing the optical system to be designed with greater freedom.

The spatial beam modulation unit 54 illustrated in FIG. 2 is a spatial beam modulation element capable of controlling the spatial density distribution of the intensity or laser power density of the emitted laser beam, and is also referred to as a spatial light modulator (SLM). The spatial beam modulation unit 54 may be selected from any known SLM devices including a reflective liquid-crystal-on-silicon (LCOS) device, a transmissive liquid-crystal panel (LCP), a deformable mirror, and a digital micro-mirror device (DMD).

Furthermore, it is preferable that the spatial beam modulation unit 54 be of the phase modulation type such that the laser irradiation surface, i.e., entrance surface, of the spatial beam modulation unit 54 and the laser irradiation surface of the workpiece 40 are nonconjugate with each other. The spatial beam modulation unit 54 be of the phase modulation type is effective to increase the efficiency with which to exploit the laser beam emitted from the laser beam source 51.

Note that the spatial beam modulation unit 54 may alternatively be of the amplitude modulation type such that the laser irradiation surface, i.e., entrance surface, of the spatial beam modulation unit 54 and the laser irradiation surface of the workpiece 40 are conjugate with each other. For example, an SLM device of the amplitude modulation type among the SLM devices referred to above, or a mask may be used as the spatial beam modulation unit 54. However, an SLM device of the amplitude modulation type, a mask, or a DMD causes a loss of the laser beam that is not applied to the workpiece 40.

The image focusing unit 55 illustrated in FIG. 2 may be a single lens or an image focusing lens as a set lens. In FIG. 2, the image focusing unit 55 includes a double-convex lens and a double-concave lens that are successively arranged.

Note that, in a case where the spatial beam modulation unit 54 is of the phase modulation type, e.g., a reflective LCOS or a deformable mirror, the spatial beam modulation element of the spatial beam modulation unit 54 may have a function as the image focusing unit 55, i.e., an image focusing lens, and the image focusing unit 55, i.e., an image focusing lens, may be omitted from the optical system.

The magnifying image focusing lens 56 magnifies an image, i.e., a conjugate image, focused by the image focusing unit 55 and focuses the magnified image on the laser irradiation surface of the workpiece 40. The magnifying image focusing lens 56 may be omitted from the optical system.

Figure 4:
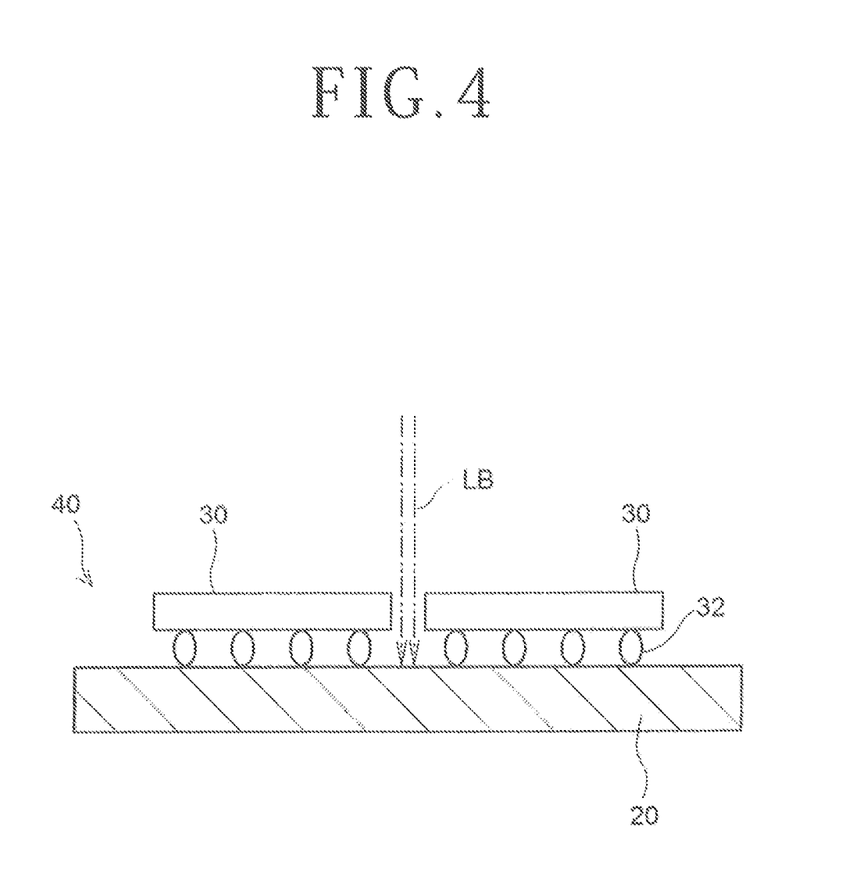
FIG. 4 is a view illustrating a parallel incident laser beam produced by a telecentric lens.

The telecentric lens 57 illustrated in FIG. 2 applies the laser beam perpendicularly to the laser irradiation surface of the workpiece 40, i.e., parallel to its own optical axis. When, as illustrated in FIG. 4, a laser beam LB is to be shaped as a parallel incident beam by the telecentric lens 57 and applied to the board 20 through a gap between adjacent semiconductor chips 30 while staying clear of the semiconductor chips 30, it is particularly effective to use the telecentric lens 57. Note that the image focusing unit 55 illustrated in FIG. 2 may be arranged as a telecentric lens, and the optical system may be arranged such that the telecentric lens 57 may be omitted therefrom.

Moreover, in a case where the optical system is arranged such that the telecentric lens 57 is included therein, the telecentric lens 57 is beneficial in that it dispenses with a highly accurate positioning process in Z-axis directions in terms of focusing the laser beam onto the laser irradiation surface. Furthermore, inasmuch as the laser beam LB is applied perpendicular to the laser irradiation surface of the workpiece 40, as illustrated in FIG. 4, the laser beam LB is prevented from being applied to the surfaces of the semiconductor chips 30 in a case where the distance between adjacent semiconductor chips 30 is small or the semiconductor chips 30 are thick.

Next, an example of laser reflow will be described below.

As illustrated in FIG. 1, the workpiece 40 is set on the processing table 3 and a processing condition is entered from the input device 200. The processing condition may be a processing condition indicating that, as illustrated in FIG. 5A, a laser beam LA is applied to only particular areas A where semiconductor chips 30 are present. The processing condition may be another processing condition indicating that, as illustrated in FIG. 5B, the laser power density of a laser beam LA applied to only particular areas A where semiconductor chips 30 are present is higher than the laser power density of a laser beam LB applied to particular areas B where no semiconductor chips 30 are present and the laser beam LB is applied directly to the board 20.

It is made possible by using the spatial beam modulation unit 54 to apply a laser beam locally to a particular area in an irradiation range and to set a distribution of laser power densities. Note that the laser power density refers to a laser power per unit area and is expressed by $W/cm^2$ as a unit of measurement. In the example of laser reflow according to the present embodiment, it is assumed that the laser power density is in the range from 10 $W/cm^2$ to 300 $W/cm^2$.

The laser power density is set depending on the material of the workpiece 40 and thicknesses of the semiconductor chips 30 and the workpiece 40 through which the laser beam is transmitted, and is in the range from 10 $W/cm^2$ to 300 $W/cm^2$ and more preferably in the range from 80 $W/cm^2$ to 300 $W/cm^2$ for reducing the irradiation time, i.e., a period of time required to reflow the solder bumps 32. While a laser beam having a laser power density higher than 300 $W/cm^2$ may be used for certain thicknesses of semiconductor chips and workpieces, such a laser beam poses a high risk of damage to devices in the workpiece 40. The laser power density is thus appropriately set in view of the risk.

The control device 100 carries out a step of controlling the image capturing camera 71 to capture an image of a surface to be processed and deciding on particular areas in an irradiation range. Then, the control device 100 individually sets laser power densities in the respective particular areas. In the example illustrated in FIG. 5B, the control device 100 decides on particular areas A and B in the irradiation range, and sets a laser power density to a higher level for the particular areas A and a laser power density to a lower level for the particular areas B.

Furthermore, prior to processing the workpiece 40, the control device 100 may decide on particular areas and set laser power densities for the particular areas. For example, prior to processing the workpiece 40, the control device 100 decides on particular areas based on various dimensions of the workpiece 40, sets laser power densities for the particular areas, and registers the particular areas and the laser power densities as processing conditions in a processing apparatus. At the same time, the control device 100 registers captured images of feature points of the workpiece 40 as targets and registers the positional relations between the targets and the particular areas in the processing apparatus. In a reflow process, the control device 100 controls the image capturing camera 71 to capture an image of the workpiece 40, detects feature points, detects particular areas, and applies a laser beam to the workpiece 40 at the registered laser power densities.

Then, on the basis of the captured image, the control device 100 positionally aligns the processing head 7 and the workpiece 40 by moving the processing table 3.

After the positional alignment, the control device 100 controls the laser beam applying unit 2 to apply a laser beam to the workpiece 40 according to the above processing conditions, melting the solder bumps 32 to electrically connect the semiconductor chips 30 and the board 20 to each other.

Note that the laser reflow apparatus 1 according to the present invention can also be used on a workpiece 40A illustrated in FIG. 5C where semiconductor chips 30A, 30B, and 30C are stacked with solder bumps 32 being present between the semiconductor chips 30A, 30B, and 30C.

Figure 6A:
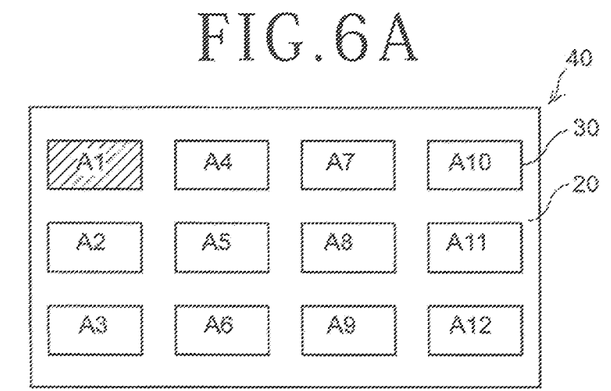
FIG. 6A is a view illustrating an example in which a laser beam is applied to the area of one semiconductor chip.
Figure 6B:
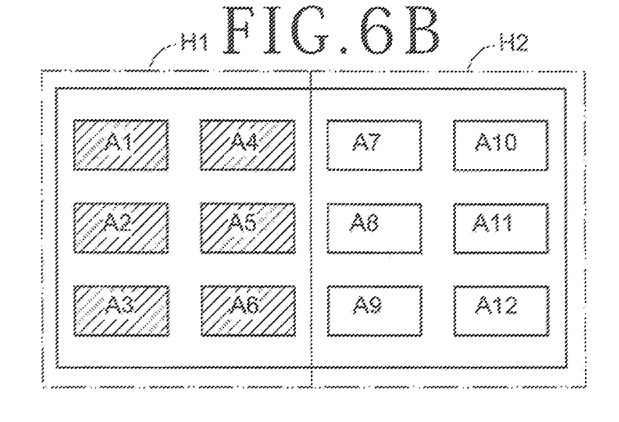
FIG. 6B is a view illustrating an example in which laser beams are applied to the areas of a plurality of semiconductor chips.
Figure 6C:
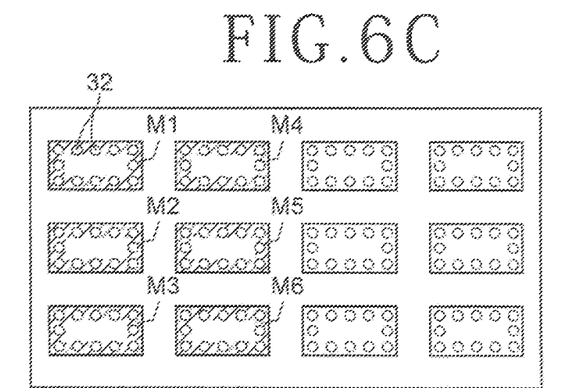
FIG. 6C is a view illustrating an example in which laser beams are applied to the areas where solder bumps are present.
Figure 6D:
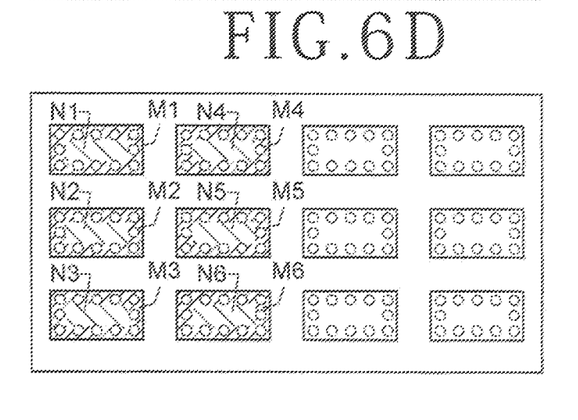
FIG. 6D is a view illustrating the manner in which different laser power densities are set for the respective areas.

Processing conditions for laser reflow processes may include, in addition to those illustrated in FIGS. 5A and 5B, a processing condition in which, as illustrated in FIG. 6A, only an area μl of one semiconductor chip 30 is set as a particular area to which a laser beam is to be applied, a processing condition in which, as illustrated in FIG. 6B, only areas μl through A6 of a plurality of semiconductor chips 30 are set as particular areas to which a laser beam is to be applied, a processing condition in which, as illustrated in FIG. 6C, only bump areas M1 through M6, where solder bumps 32 are present, of a plurality of semiconductor chips 30 are set as particular areas to which a laser beam is to be applied, and a processing condition in which, as illustrated in FIG. 6D, a higher laser power density is set for bump areas M1 through M6, where solder bumps 32 are present, of a plurality of semiconductor chips 30 and a lower laser power density is set for bump-free areas N1 through N6 where no solder bumps are present.

Figure 7A:
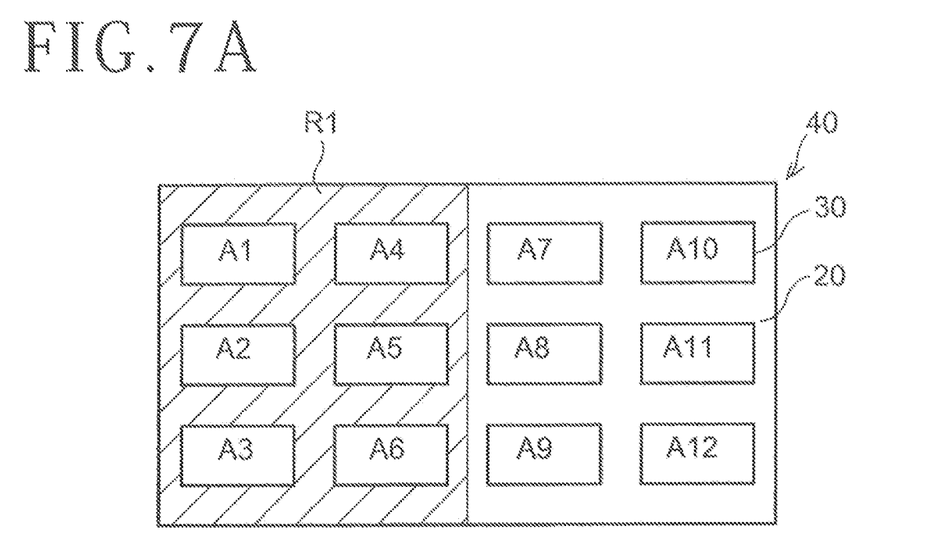
FIG. 7A is a view illustrating an example in which a laser beam is applied to only a surface of a board.
Figure 7B:
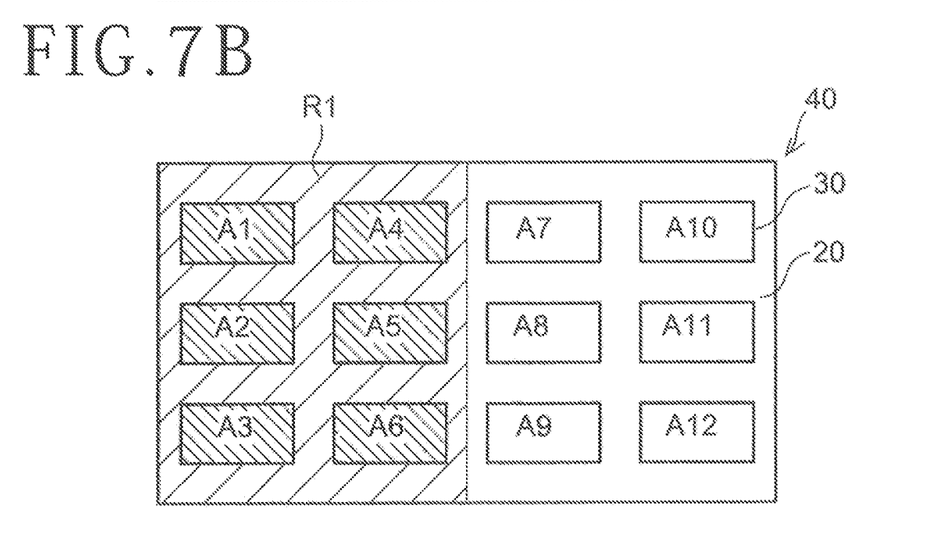
FIG. 7B is a view illustrating the manner in which different laser power densities are set for the respective areas.

Furthermore, processing conditions for laser reflow processes may include a processing condition in which, as illustrated in FIG. 7A, only an exposed area R1 on a face side of the board 20 where no semiconductor chips 30 are present but the board 20 is exposed is set as a particular area to which a laser beam is to be applied, and a processing condition in which, as illustrated in FIG. 7B, a higher laser power density is set for the exposed area R1 and a lower laser power density is set for the areas μl through A6 of the semiconductor chips 30, or conversely, a lower laser power density is set for the exposed area R1 and a higher laser power density is set for the areas μl through A6 of the semiconductor chips 30.

Furthermore, in a case where the semiconductor chips 30A, 30B, and 30C are stacked to minimize damage to the semiconductor chips 30A, 30B, and 30C as illustrated in FIG. 5C, it may be effective to set the laser power density of a laser beam to be applied to the semiconductor chips to a lower level. Alternatively, the laser power density of a laser beam to be applied to the board 20 may be set to a higher level or a laser beam may be applied to only the board 20 for thereby melting the solder bumps 32 easily due to a temperature rise of the board 20.

In the example illustrated in FIG. 5C, if a laser beam is uniformly applied to the workpiece 40A, semiconductor chips 30A in an uppermost layer may possibly be heated excessively, damaging devices on the semiconductor chips 30A before solder bumps 32 of semiconductor chips 30C in a lower most layer are melted. To avoid this problem, the laser power density of a laser beam to be applied to areas where semiconductor chips are present is set to a lower level and a laser beam having a higher laser power density is applied to a board 20A, i.e., an Si interposer, so that the board 20A is positively heated and the solder bumps 32 of the semiconductor chips 30C in the lower most layer are melted by heat conduction from the board 20A. Using the board 20A as a heat source in this manner, it is possible to uniformly melt the solder bumps 32 of the semiconductor chips 30A, 30B, and 30C, thus making it possible to prevent damage to devices on the semiconductor chips 30A, 30B, and 30C.

Furthermore, in a case where the workpiece 40 is large and has a wide irradiation range, a local laser beam may repeatedly be applied to perform stepwise laser beam irradiation. In FIG. 6B, for example, a range including the particular areas μl through A6 may be set as an irradiation range H1, and a laser beam may be applied to the particular areas μl through A6 included in the irradiation range H1. Then, a range including remaining particular areas A7 through A12 may be set as an irradiation range H2, and a laser beam may be applied to the particular areas A7 through A12 included in the irradiation range H2.

Next, an irradiation range changing unit for performing stepwise laser beam irradiation will be described below.

The laser reflow apparatus 1 illustrated in FIG. 1 incorporates an irradiation range changing unit for performing stepwise laser beam irradiation. Specifically, the irradiation range H1 illustrated in FIG. 6B can be changed to the irradiation range H2 by moving the processing table 3 in X- and Y-axis directions. By thus moving the processing table 3 in X- and Y-axis directions, the irradiation range H1 and the irradiation range H2 are successively processed by the laser beam until a laser reflow process is performed on the workpiece 40 in its entirety. In this case, the irradiation range changing unit is realized by the processing table 3 movable by the X- and Y-axis moving mechanisms, as illustrated in FIG. 1.

Figure 8:
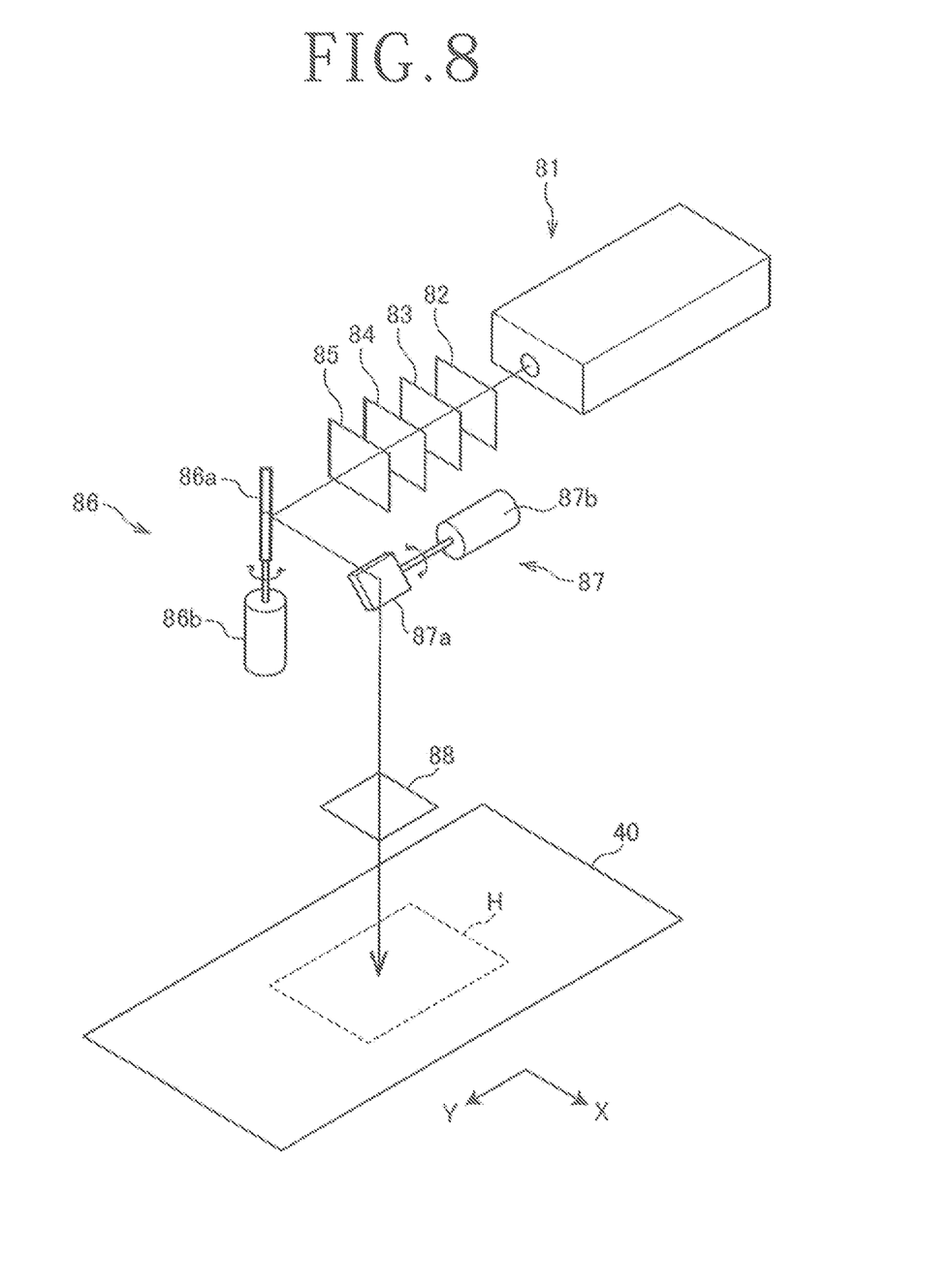
FIG. 8 is a perspective view of an optical system according to another embodiment of the present invention.
Figure 9:
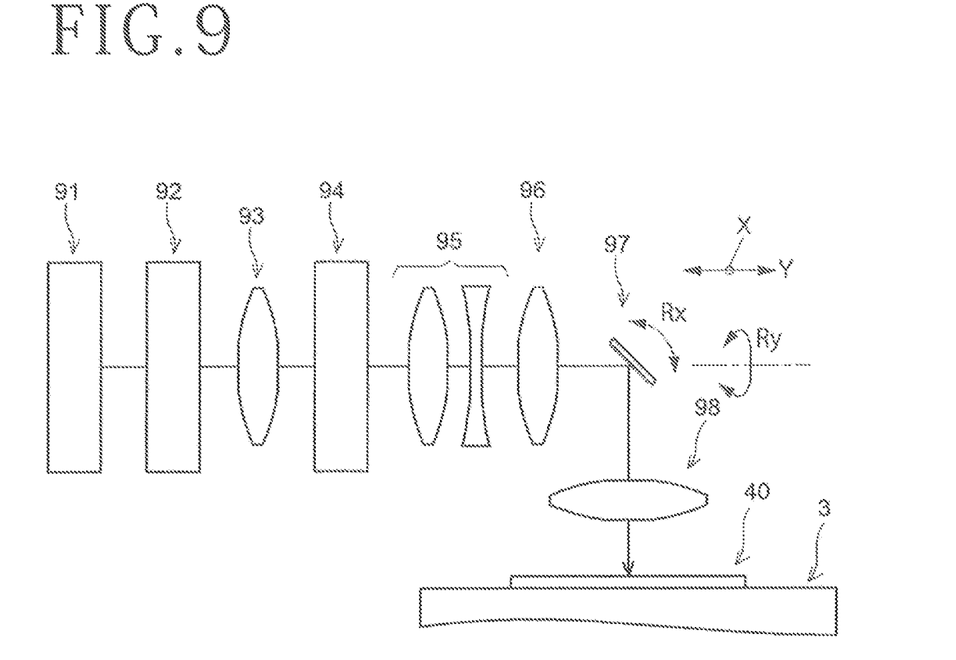
FIG. 9 is a block diagram illustrating an optical system according to still embodiment of the present invention.

Alternatively, the irradiation range changing unit may be realized by optical systems illustrated in FIGS. 8 and 9. The optical system illustrated in FIG. 8 includes a laser beam source/uniformly applying unit 81, a relay lens 82, a spatial beam modulation element or spatial beam modulation unit 83, an image focusing lens or image focusing unit 84, a relay lens 85, a first galvanometer scanner 86, a second galvanometer scanner 87, and a relay lens 88. The first galvanometer scanner 86 includes a first mirror 86a and an actuator 86b, whereas the second galvanometer scanner 87 includes a second mirror 87a and an actuator 87b.

The first mirror 86a of the first galvanometer scanner 86 deflects, in the Y-axis directions, a laser beam emitted from the laser beam source/uniformly applying unit 81 and transmitted through the spatial beam modulation element 83, and the second mirror 87a of the second galvanometer scanner 87 deflects the laser beam in the X-axis direction, thereby moving an irradiation range H to a desired position on the workpiece 40.

Furthermore, the optical system illustrated in FIG. 9 includes a laser beam source 91, a uniform applying unit 92, a relay lens 93, a spatial beam modulation element or spatial beam modulation unit 94, an image focusing lens or image focusing unit 95, a relay lens 96, a biaxial micro-electro-mechanical systems (MEMS) mirror 97, and a relay lens 98.

The biaxial MEMS mirror 97 is rotatable in Rx directions about a first rotational axis extending in the X-axis directions to deflect a laser beam in the Y-axis directions, and also rotatable in Ry directions about a second rotational axis extending in the Y-axis directions to deflect the laser beam in the X-axis directions. Therefore, the biaxial MEMS mirror 97 deflects the laser beam in the X- and Y-axis directions to move the irradiation range H to a desired position on the workpiece 40.

Next, the pressing member for restraining the board from warping will be described below.

During a laser reflow process, it is preferable to place the pressing member 60 in facing relation to the upper surfaces of the semiconductor chips 30 and press the pressing member 60 from above against the semiconductor chips 30 to prevent the board 20 from warping. The pressing member 60 mechanically restrains the board 20 from warping, thereby preventing bump connection failures more reliably.

It may restrain warping of the board 20 by abutting the pressing member 60 to the upper surfaces of the semiconductor chips 30. Alternatively, as small gap may be provided between the pressing member 60 and the upper surfaces of the semiconductor chips 30 to restrain warping of the board 20 from progressing when the board 20 is warped.

The pressing member 60 is constructed as a plate of quartz glass that transmits therethrough a laser beam LA having a wavelength ranging from 400 nm to 1100 nm, for example. Furthermore, as illustrated in FIG. 1, the pressing member 60 is disposed above the processing table 3 and has its vertical position adjustable when it is lifted or lowered by the lifting and lowering mechanism 62.

Next, monitoring the temperature of the workpiece 40 in a laser reflow process will be described below.

When a laser reflow process is performed on the workpiece 40 by applying a laser beam thereto, the temperature detector 72 illustrated in FIG. 1 measures the temperature of the workpiece 40 in real time to monitor whether the laser reflow process is being performed at a predetermined temperature or not. If necessary, it is preferable to perform a feedback control process for additionally applying a laser beam, changing the laser power density of the laser beam, or stopping applying the laser beam at the time the predetermined temperature has been reached, to thereby prevent the workpiece 40 from being overheated, for example.

Such a temperature monitoring process is effective to prevent electrical connection failures due to solder bump melting failures, etc. more reliably.

The present invention described above offers various advantages to be described below.

Since the laser reflow apparatus incorporates the spatial beam modulation unit, it is capable of setting a laser power density to a desired level locally within the irradiation range. For example, a laser beam having a high laser power density can be applied to only solder bump areas to reliably melt solder bumps while restraining the workpiece from warping by not wastefully heating unnecessary areas, thereby preventing pump connection failures.

Moreover, as illustrated in FIG. 6B, the irradiation range changing unit incorporated in the laser reflow apparatus 1 is capable of changing between the irradiation ranges H1 and H2 on the workpiece 40. With the irradiation range changing unit, the optical system included in the laser reflow apparatus 1 does not require a large image focusing lens and hence can be constructed of a compact assembly of optical components.

Note that, according to the embodiment illustrated in FIG. 1, the irradiation range changing unit is constructed as the processing table 3. According to the embodiment illustrated in FIG. 8, the irradiation range changing unit is constructed as the first galvanometer scanner 86 and the second galvanometer scanner 87. According to the embodiment illustrated in FIG. 9, the irradiation range changing unit is constructed as the biaxial MEMS mirror 97.

Furthermore, as illustrated in FIG. 6D, the spatial beam modulation unit 54 can set the laser power density of a laser beam to be applied to the bump areas M1 through M6 where solder bumps 32 are present in the irradiation range to a level higher than the laser power density of a laser beam to be applied to the bump-free areas N1 through N6 where no bumps are present. Therefore, the bump areas can selectively be heated without wastefully heating unnecessary areas of the board 20, thereby restraining the board 20 from warping.

Particularly in a case where a stack of semiconductor chips is heated, as illustrated in FIG. 5C, if they are heated enough to reflow the solder bumps on the semiconductor chip near the board, then the device on the uppermost semiconductor chip is liable to be damaged. Therefore, it is effective to apply a laser beam to only bump areas. Furthermore, since devices may be prevented from being damaged by heating only the board as illustrated in FIG. 7A or reducing the laser power density on semiconductor chips, it is preferable to optimize the design of laser power densities in respective areas.

Furthermore, as illustrated in FIG. 2, the optical system of the laser beam applying unit 2 includes the uniform irradiation unit 52 that is disposed between the laser beam source 51 and the spatial beam modulation unit 54 for uniformizing the laser power density of the laser beam emitted from the laser beam source 51 on the entrance surface of the spatial beam modulation unit 54. Because of the uniform irradiation unit 52, the energy distribution of the laser beam from the laser beam source 51 is not directly reflected on the irradiation surface of the workpiece 40, but the energy distribution of the laser beam on the irradiation surface of the workpiece 40 is uniformized, making it possible to reflow the solder bumps 32 uniformly with reduced energy variations.

Moreover, in a case where the laser beam source 51 includes a plurality of laser beam sources, it is possible to inexpensively construct the laser beam source 51 that is capable of producing high laser output power.

Furthermore, the temperature detector 72 for detecting the temperature of the upper surface of the workpiece 40 as illustrated in FIG. 1 makes it possible to monitor the temperature.

If necessary, it is thus possible to perform a feedback control process for additionally applying a laser beam, changing the laser power density of the laser beam, or stopping applying the laser beam at the time the predetermined temperature has been reached, to thereby prevent the workpiece 40 from being overheated, for example. Such a temperature monitoring process is effective to prevent electrical connection failures due to solder bump melting failures, etc. more reliably.

Figure 10:
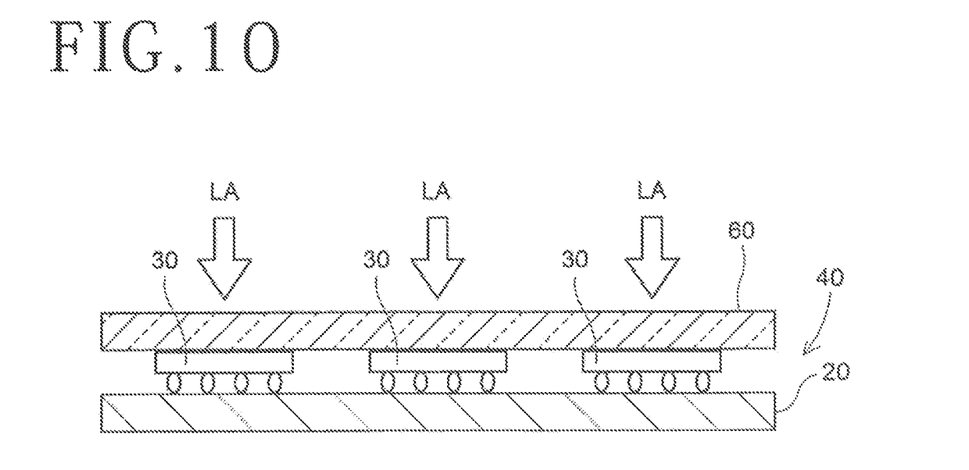
FIG. 10 is a view illustrating how a board is restrained from warping by a pressing member.

Moreover, the pressing member 60, made of a material that is capable of transmitting therethrough a laser beam applied to the workpiece 40, for pressing the upper surface of the workpiece 40, as illustrated in FIG. 10, mechanically restrains the board 20 from warping, thereby preventing bump connection failures more reliably.

Furthermore, in the laser reflow method according to the present embodiment, as illustrated in FIGS. 5A through 7B, the control device 100 decides on a plurality of particular areas in an irradiation range, and individually sets laser power densities for laser beams to be applied to the particular areas. Therefore, for example, a laser beam having a higher laser power density is applied to only bump areas to reliably melt solder bumps while restraining the board from warping by not wastefully heating unnecessary areas of the board, thereby preventing pump connection failures.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser reflow apparatus for reflowing solder bumps disposed on a side of a semiconductor chip in a workpiece and included in an irradiation range on the workpiece by applying a laser beam to an opposite side of the semiconductor chip, the laser reflow apparatus comprising:
- a spatial beam modulation unit including a laser power density setting function to locally set the laser power density in the irradiation range of a laser beam emitted from a laser beam source; and
- image focusing means configured and arranged unit to focus the laser beam emitted from the laser beam source and apply the focused laser beam to the irradiation range on the workpiece,
- wherein the spatial beam modulation unit is of the phase modulation type and is configured and arranged such that an entrance surface of the spatial beam modulation unit and a laser irradiation surface of the workpiece are nonconjugate with each other.

2. The laser reflow apparatus according to claim 1, further comprising:
- an irradiation range changing unit for changing a position of the irradiation range on the workpiece.

3. The laser reflow apparatus according to claim 1, wherein:
- the spatial beam modulation unit sets a laser power density of a laser beam applied to a bump area where solder bumps are present in the irradiation range to a level higher than a laser power density of a laser beam applied to a bump-free area where no bumps are present.

4. The laser reflow apparatus according to claim 1, further comprising:
- a uniform irradiation unit disposed between the laser beam source and the spatial beam modulation unit, for uniformizing the laser power density of the laser beam emitted from the laser beam source on an entrance surface of the spatial beam modulation unit.

5. The laser reflow apparatus according to claim 1, wherein the laser beam source includes a plurality of laser beam sources.

6. The laser reflow apparatus according to claim 1, further comprising:
- a temperature detector for detecting a temperature of an upper surface of the workpiece.

7. The laser reflow apparatus according to claim 1, further comprising:
- a pressing member for pressing an upper surface of the workpiece, the pressing member being made of a material that is capable of transmitting therethrough a laser beam applied to the workpiece.

8. A laser reflow method using a laser reflow apparatus for reflowing solder bumps disposed on a side of a semiconductor chip in a workpiece and included in an irradiation range on the workpiece by applying a laser beam to an opposite side of the semiconductor chip, the laser reflow apparatus including:
- a spatial beam modulation unit including a laser power density setting function to locally set the laser power density in the irradiation range of a laser beam emitted from a laser beam source, and
- image focusing means configured and arranged to focus the laser beam emitted from the laser beam source and apply the focused laser beam to the irradiation range on the workpiece the laser reflow method comprising:
- generating the laser beam from the laser beam source;
- individually setting the laser power densities of the laser beams to be applied respectively to particular areas in the irradiation range; and wherein the spatial beam modulation unit is a device selected from the group consisting of: (i) a phase modulation device that is configured and arranged such that an entrance surface of the spatial beam modulation unit and a laser irradiation surface of the workpiece are nonconjugate with each other, and (ii) an amplitude modulation device that is configured and arranged such that an entrance surface of the spatial beam modulation unit and a laser irradiation surface of the workpiece are conjugate with each other.

9. The laser reflow apparatus according to claim 1, wherein the image focusing means is integrated into the spatial beam modulation unit.

10. The laser reflow apparatus according to claim 1, wherein the image focusing means is separate from the spatial beam modulation unit, and further wherein the image focusing means comprises at least one image focusing lens.

11. The laser reflow apparatus according to claim 1, wherein the image focusing means is separate from the spatial beam modulation unit, and further wherein the image focusing means comprises a double-convex lens and a double-concave lens that are successively arranged.

12. The laser reflow method according to claim 8, wherein the image focusing means is integrated into the spatial beam modulation unit.

13. The laser reflow method according to claim 8, wherein the image focusing means is separate from the spatial beam modulation unit, and further wherein the image focusing means comprises at least one image focusing lens.

14. The laser reflow method according to claim 8, wherein the image focusing means is separate from the spatial beam modulation unit, and further wherein the image focusing means comprises a double-convex lens and a double-concave lens that are successively arranged.

15. The laser reflow apparatus according to claim 1, wherein the spatial beam modulation unit is a device selected from the group consisting of a reflective liquid-crystal-on-silicon device, a deformable mirror and a transmissive liquid-crystal panel.

16. A laser reflow apparatus for reflowing solder bumps disposed on a side of a semiconductor chip in a workpiece and included in an irradiation range on the workpiece by applying a laser beam to an opposite side of the semiconductor chip, the laser reflow apparatus comprising:
- a spatial beam modulation unit including a laser power density setting function to locally set the laser power density in the irradiation range of a laser beam emitted from a laser beam source; and
- image focusing means configured and arranged to focus the laser beam emitted from the laser beam source and apply the focused laser beam to the irradiation range on the workpiece,
- wherein the spatial beam modulation unit is of the amplitude modulation type and is configured and arranged such that an entrance surface of the spatial beam modulation unit and a laser irradiation surface of the workpiece are conjugate with each other.

17. The laser reflow apparatus according to claim 16, wherein the spatial beam modulation unit is a digital micromirror device.

18. The laser reflow method according to claim 8, wherein the spatial beam modulation unit is a device selected from the group consisting of a reflective liquid-crystal-on-silicon device, a deformable mirror and a transmissive liquid-crystal panel.

19. The laser reflow method according to claim 8, wherein the spatial beam modulation unit is a digital micro-mirror device.

\* \* \* \* \*

UNITED STATES PATENT AND TRADEMARK OFFICE
CERTIFICATE OF CORRECTION

PATENT NO. : 11,935,863 B2
APPLICATION NO. : 17/123318
DATED : March 19, 2024
INVENTOR(S) : Satoshi Kobayashi et al.

It is certified that error appears in the above-identified patent and that said Letters Patent is hereby corrected as shown below:

In the Claims

Column 13, Line 7, Claim 1, delete "unit".

Column 13, Line 67, Claim 8, after "range; and", insert the following -- passing the laser beam generated in the generating step through the spatial beam modulation unit before applying the laser beam to the workpiece, and --.

Signed and Sealed this
Twenty-first Day of May, 2024

Katherine Kelly Vidal
*Director of the United States Patent and Trademark Office*